United States Patent
Pravda

(10) Patent No.: US 6,814,134 B1
(45) Date of Patent: Nov. 9, 2004

(54) COMPACT ELECTRONIC CABINET COOLER

(75) Inventor: Milton F. Pravda, Towson, MD (US)

(73) Assignee: Mary E. Brezinski, Cockeysville, MD (US)

(*) Notice: Subject to any disclaimer, the term of this patent is extended or adjusted under 35 U.S.C. 154(b) by 0 days.

(21) Appl. No.: 09/705,456

(22) Filed: Nov. 2, 2000

Related U.S. Application Data

(60) Provisional application No. 60/177,992, filed on Jan. 24, 2000.

(51) Int. Cl.$^7$ ............................. F28D 11/02; F28D 15/02
(52) U.S. Cl. ................. 165/86; 165/104.21; 165/104.33
(58) Field of Search ........................ 165/104.34, 104.12, 165/104.33, 86, 104.21, 88

(56) References Cited

U.S. PATENT DOCUMENTS

| | | | | |
|---|---|---|---|---|
| 3,863,454 A | * | 2/1975 | Doerner ........................ | 60/669 |
| 3,902,549 A | * | 9/1975 | Opfermann .................. | 165/88 |
| 4,064,932 A | * | 12/1977 | Iriarte ......................... | 165/86 |
| 4,196,504 A | * | 4/1980 | Eastman ................ | 165/104.26 |
| 4,401,151 A | * | 8/1983 | Pozsicsanyi ........... | 165/104.26 |
| 4,640,344 A | * | 2/1987 | Pravda ........................ | 165/86 |
| 4,660,629 A | * | 4/1987 | Maier-Laxhuber et al. ...... | 165/104.12 |
| 5,123,479 A | * | 6/1992 | Pravda ........................ | 165/86 |
| 5,279,359 A | * | 1/1994 | Erickson ..................... | 165/86 |
| 5,297,619 A | * | 3/1994 | Faghri ........................ | 165/86 |

FOREIGN PATENT DOCUMENTS

| | | | | |
|---|---|---|---|---|
| DE | 2743708 | * | 4/1979 | ............ 165/104.33 |
| GB | 1600404 | * | 10/1981 | .................. 165/86 |
| JP | 0033624 | * | 3/1979 | .................. 165/86 |
| JP | 0229188 | * | 12/1984 | ............ 165/104.34 |
| JP | 402118379 | * | 5/1990 | ............ 165/104.34 |
| JP | 404230099 | * | 8/1999 | ............ 165/104.34 |
| SU | 1083065 | * | 3/1984 | .................. 165/86 |

* cited by examiner

*Primary Examiner*—Ramesh Krishnamurthy
(74) *Attorney, Agent, or Firm*—Olson & Olson

(57) ABSTRACT

A compact cabinet cooler includes a housing made of two basket sections secured to a cabinet with one basket section extending into the cabinet and the other section extending outward of the cabinet. The housing encloses a plurality of heat transport tubes extending through a central plate and spaced apart in an annular array. The central plate is mounted on the rotor of an electric motor the stator of which is secured to a shaft anchored at its ends to the housing. Rotation of the motor rotor causes rotation of the central plate and the array of heat transport tubes. The tubes mount a multiplicity of spaced apart thin annular fins of heat conductive material and the tubes contain a heat transfer liquid for moving heat from the evaporator section of the housing to the condenser section of the housing. When the heat transport tubes are Perkins tubes, the heat transfer liquid fills the tubes about half full; if they are heat pipes a layer of sintered porous heat conductive material is bonded to the inner surface of the tubes and the heat transfer liquid fills only the pores in the sintered material.

10 Claims, 2 Drawing Sheets

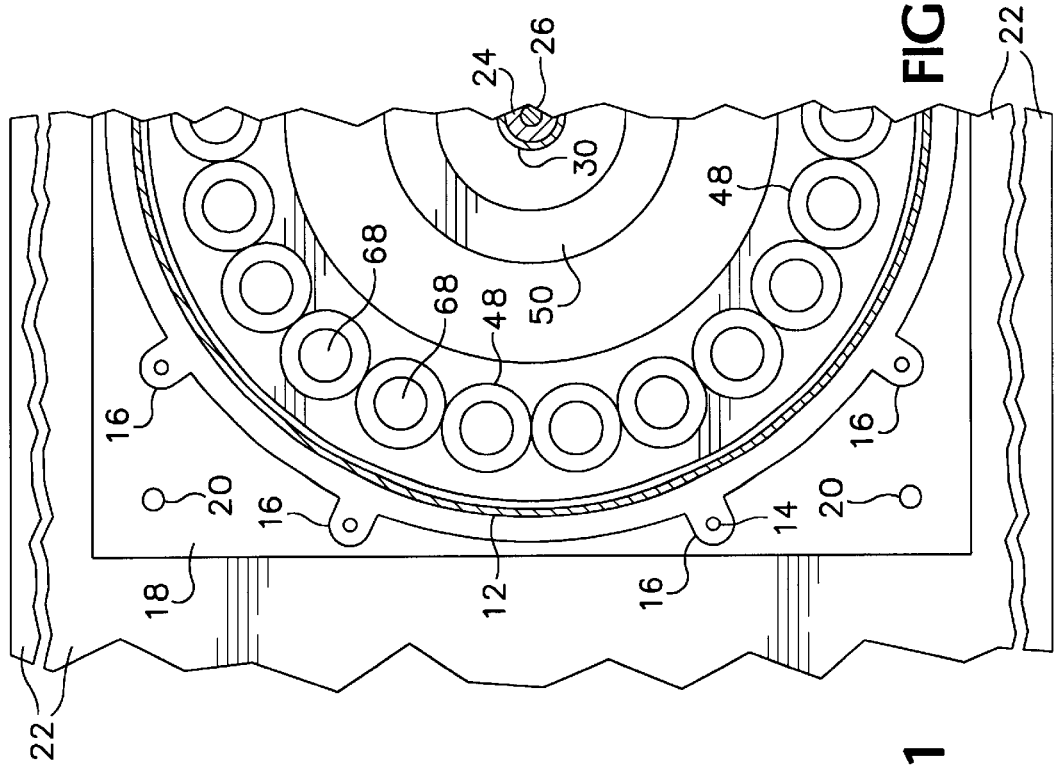
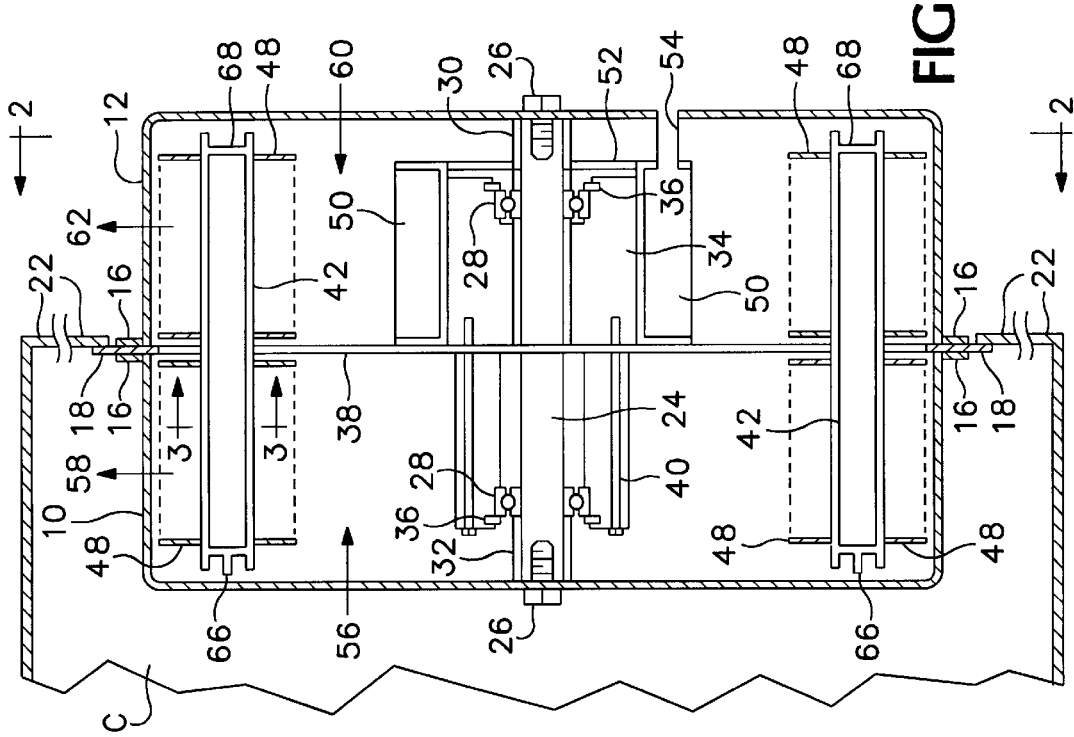
FIG.1
FIG.2

COMPACT ELECTRONIC CABINET COOLER

This invention claims the benefit of Provisional application Ser. No. 60/177,992, filed 24 Jan. 2000.

BACKGROUND OF THE INVENTION

This invention relates to the cooling of cabinets and other spaces that house electronic equipment, and more particularly to an improved cooler of compact design for use in cooling cabinets of small configuration.

Electrical and electronic components are mounted in racks and drawers and enclosed in cabinets to protect them from dust and dirt and to shield high voltages from accidental human contact. During operation, these components produced waste heat, and this waste heat will increase the temperature within the cabinets. High temperatures reduce the operating lifetimes of many electronic components and are detrimental to electrical and electronic insulations.

Various means may be employed to remove the heat within the cabinet indirectly. A water- or refrigerant-cooled heat exchanger may be located within the cabinet. Alternatively, a heat pipe heat exchanger may be mounted on the cabinet wall such that the evaporator portion is within the cabinet and the condenser portion is located external to the cabinet enclosure. Regarding water cooled heat exchangers, a source of cooled water is not always available in the vicinity of electrical and electronic cabinets. Moreover, the use of water in conjunction with electrical equipment, is not advisable. In the place of water cooled heat exchangers, the use of refrigerant-cooled heat exchangers may, with the proper choice of refrigerant, be made compatible with electrical equipment. However, a separate heat pump is required to cool the refrigerant.

Fans often are supplied with water or refrigerant cooled units in order to reduce the size of the finned coils within the cabinet. Cabinets coolers of the heat pipe variety require a fan within the cabinet and another fan external to the cabinet in order to reduce the volume of the cooler to manageable proportions. Fans beat the air to force it to move and, consequently, fans are inefficient air movers and they create annoying noise. This noise, which can exceed 50 decibels, cannot be tolerated in some military and commercial applications.

SUMMARY OF THE INVENTION

In its basic concept, the compact cabinet cooler of this invention includes a plurality of Perkins tubes or heat pipes mounted for rotation within a perforated housing, with the condenser end portion of the Perkins tubes/heat pipes within the housing projecting outward of the cabinet.

The principal objective of this invention is to provide a quiet, compact electronic cabinet cooler which may be mounted on the top or on the side walls of a cabinet.

Another objective of this invention is to provide a compact cabinet cooler which uses either Perkins tubes or heat pipes as heat transfer tubes.

Still another objective of this invention is to provide a cooler which is usable with cabinets of various sizes and shapes.

A further objective of this invention is to provide a cabinet cooler in which the condensation section is positioned outside the cabinet, so that the heat generated within the cabinet is exhausted to the atmosphere.

A still further objective of this invention is the provision of a compact cabinet cooler of simplified construction for economical manufacture, maintenance and repair.

The foregoing and other objects and advantages of this invention will appear from the following detailed description, taken in connection with the accompanying drawings of preferred embodiments.

BRIEF DESCRIPTION OF THE DRAWINGS

FIG. 1 is a fragmentary vertical sectional view of a compact cabinet cooler embodying the features of this invention, the cooler being shown mounted on a cabinet to be cooled.

FIG. 2 is a fragmentary sectional view taken on the line 2—2 in FIG. 1.

DESCRIPTION OF THE PREFERRED EMBODIMENTS

Figure 3:
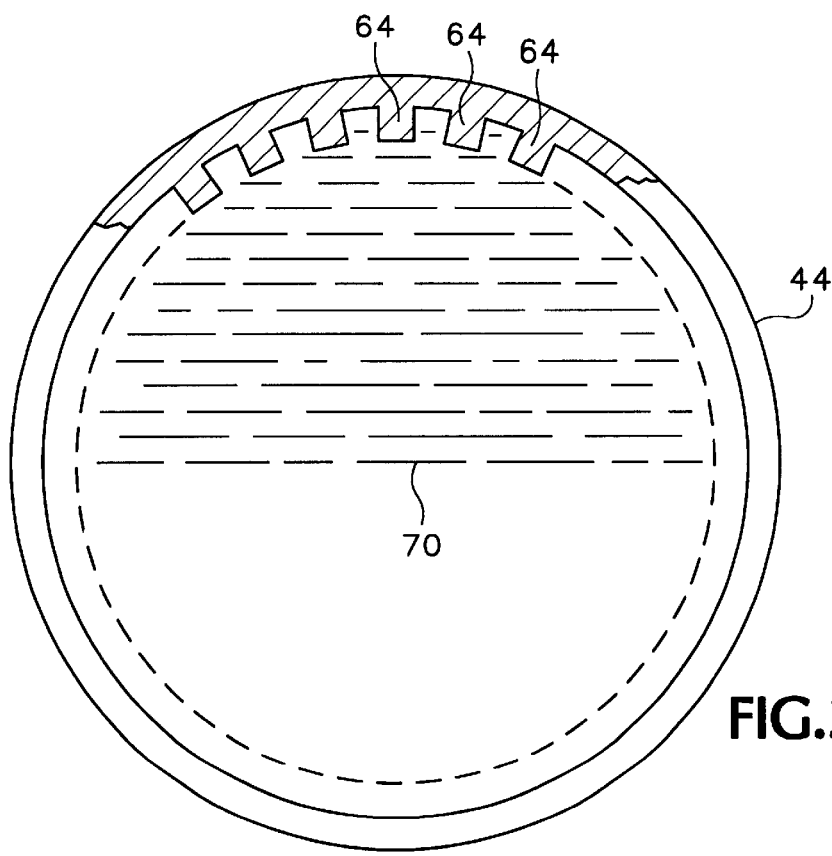
FIG. 3 is a sectional view, on an enlarged scale, taken on the line 3—3 in FIG. 1.

This invention provides a quiet, compact electronic cabinet cooler which may be mounted on the top or on the side walls of a cabinet. This purpose is accomplished by employing heat transfer tubes, in the form of Perkins tubes or heat pipes, to transfer the heat from within the cabinet to the ambient air surrounding the cabinet. The tubes are arranged within a perforated housing in an annular array, and the external surfaces of the tubes are extended by providing a plurality of closely spaced annular fins in intimate, heat conducting contact therewith. The assembly is rotated to provide airflow and heat exchange in that portion within the electronic cabinet and air flow and heat exchange in that portion external to the cabinet.

FIGS. 1 and 2 illustrate the general construction and arrangement of a compact electronic cabinet cooler in a preferred embodiment. As shown, the cooler includes two welded wire mesh baskets 10 and 12 which are cylindrical in form and are joined by bolts 14 through basket brackets 16 to a cabinet mounting plate 18. The mounting plate is secured by bolts 20 to a wall 22 of a cabinet C to be cooled.

Stationary shaft 24 is secured at each end to the wire baskets 10 and 12 by shaft bolts 26. Two bearings 28 are mounted on shaft 24 and the inner races are positioned axially by first rotor standoff 30 and by second rotor standoff 32. The outer races of bearings 28 are positioned by recesses in rotor 34 and held in place by conventional split spring retainer rings 36. This arrangement secures the axial position of rotor 34 within the enclosure created by the wire baskets and the cabinet mounting plate 18.

Rotor 34 is attached to central support plate 38 by rotor bolts 40. Onto the central support plate is mounted an annular array of heat transport elements 42, shown as Perkins tubes 44 in FIG. 3 and as heat pipes 46 in FIG. 4. The outer surfaces of the Perkins tubes and heat pipes are extended by closely spaced, tightly fitting annular fins 48 of heat conductive material secured in heat conductive relation with the Perkins tubes and heat pipes. The rotor central support plate 38, Perkins tubes or heat pipes and fins rotate as an assembly on bearings 28.

Rotor 34 is surrounded at the motor end by a shaded pole stator 50. The stator is stationary and is secured to the shaft 24 by stator support plate 52 which is attached to the first rotor standoff 30 at the motor end of shaft 24. The shaded pole stator 50 has traditional electrical windings the power for which is supplied by electrical leads extending through wire trough 54. Reaction torque on shaded pole stator 50 is resisted by the clamping force of shaft bolts 26 which may be supplied with lock washers or the like.

The compact electronic cabinet cooler illustrated is mounted in the wall 22 of an electronic cabinet C by cutting a hole in the wall slightly larger than the diameter of wire basket 10, and securing the cabinet mounting plate 18 to the wall by means of mounting plate attachment bolts 20. The preferred mounting orientation is to locate the motor rotor 34 and the accompanying shaded pole stator 50 external to the cabinet, thereby eliminating further heating of the cabinet interior as a result of the electrical losses in the motor. The wall 22 to which the cabinet cooler described herein is mounted may be either the top, a side, or the back of the electronic cabinet.

Cabinet air 56 is drawn into the electronic cabinet cooler through the perforations in wire basket 10, as a consequence of rotational shear forces developed within the spaces between fins 48. Cooled cabinet air 58 is expelled from the cooler through basket 10 after passing through the air spaces between adjacent fins 48. Ambient air 60 is drawn into the cabinet cooler through the perforations in wire basket 12. Heated ambient air 62 is expelled from the cabinet cooler through the perforations in wire basket 12.

Figure 4:
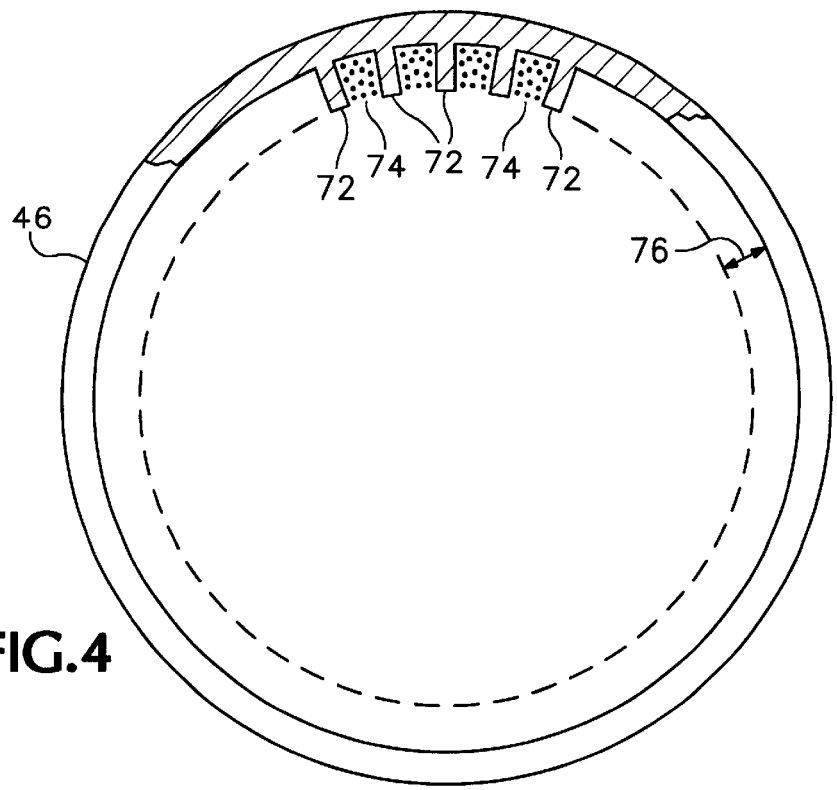
FIG. 4 is a sectional view similar to FIG. 3, with the Perkins tubes of FIG. 3 replaced by a heat pipe construction.

FIGS. 3 and 4 illustrate the construction of the Perkins tubes and heat pipes, respectively. These views represent the configurations of the respective heat transport tubes throughout their entire length.

The Perkins tube 42 illustrated in FIG. 3 is constructed, as by extrusion, with equally spaced stubby projections 64 around the internal wall circumference. Projections 64 are longitudinal and extend from fill tube 66 to end cap 68. The Perkins tube is about 50% filled with working fluid 70 consisting of a chemical water solution preferably formulated in accordance with the teachings of U.S. Pat. No. 5,945,031. The stubby projections 64 increase the effective internal surface area by about a factor of two and, thereby, increase the efficiency of transferring heat from the tube wall to the working fluid 70 by 100%. The same increase in heat transfer efficiency is obtained with other working fluids such as methanol, Freon-11, acetone, and ammonia. If the efficiency of transferring heat from the tube wall to chemically treated water in a high force field is taken as 100%, the efficiency for methanol is 50%, Freon-11 is 30%, acetone is 52% and ammonia is 183%. The use of Freon-11 and ammonia is not recommended because Freon-11 has a positive pressure of 10 psi and ammonia has a positive pressure of 200 psi at the working temperature of the compact electronic cabinet cooler. A rupture of the Perkins tube wall would cause the working fluid, when operating under a positive pressure, to escape from the tube. The resulting imbalance will cause physical destruction of the device during operation.

The heat pipe 46 illustrated in FIG. 4 is constructed, as by extrusion, with equally spaced relatively thin longitudinally extending internal projections 72. The space between the projections is occupied by a sintered porous medium 74. This porous medium must be made from materials which possess a relatively high thermal conductivity and must be compatible with the selected working fluid. As is taught in U.S. Pat. No. 3,523,577 a porous boiling surface made from pure nickel, which has 24% of the thermal conductivity of pure copper, exhibits a boiling heat transfer coefficient of only 34% of that exhibited by a surface made from pure copper. When the working fluid selected is pure water, the material of the sintered porous medium 74 is copper, and when the working fluid selected is ammonia the material of the sintered porous medium is aluminum. Because the amount of working fluid is only that required to fill the pores in the sintered medium and supply the internal vapor, working fluids which have a positive pressure may be used since the loss of this small quantity of working fluid will not cause severe imbalance during operation.

Sintered porous medium 74 serves two functions: It retains the working fluid in the space between projections 72 in the presence of centrifugal force fields greater than 200 gravities, and it transports the working fluid from the condenser section, i.e. the section of the heat pipe outside the cabinet enclosure, to the evaporator section, i.e. the section of the heat pipe inside the cabinet enclosure.

The effective size of the pores in sintered porous medium 74 determines the pumping height resulting from capillary action for a selected working fluid, in accordance with the teachings of U.S. Pat. No. 3,523,577. The pumping height must be greater than the product of the height 76 of projection 72 and the centrifugal force field stated in gravities. For example, if the height 76 of projections 72 is 0.04 inch and the force field is 300 gravities, the minimum pumping height must be 12 inches for the selected working fluid.

For a medium 74 made from copper and employing pure water as the working fluid, the maximum effective pore diameter cannot exceed 1.5 mils in the force field of 300 gravities when the height 76 of projection 72 is 40 mils. In the absence of projections 72, an effective pore size of 1.5 mils in a porous medium on the inside wall of a heat pipe which has an inside diameter of 0.5 inch, will only work properly when the force field is below 24 gravities and the working fluid is pure water, i.e. 12 divided by 0.5=24.

The ability of sintered porous medium 74 to pump liquid from the condenser to the evaporator is determined by its permeability. It has been found that if the sintered porous medium is formulated by employing a narrow size range of spherical particles, then the permeability increases as the 2.25 power of the pore size. Since the amount of liquid pumped per unit time from the condenser to the evaporator is directly proportional to the heat carrying capacity of the heat pipe 46, larger pore sizes will result in an increase in its heat carrying capacity in the presence of lower centrifugal force fields. Conversely, decreasing the pore size reduces the ability of the heat carrying capacity of the heat pipe in the presence of high centrifical force fields. For a typical compact electronic cabinet cooler employing water as the working fluid, the following Table I illustrates these relationships for a 0.55 inch diameter heat pipe which is 5 inches long.

TABLE 1

| Pore Size mils | Permeability Darcys | Force Field Gravities | Carrying Power Btu/hr |
| --- | --- | --- | --- |
| 0.5 | 2.3 | 760 | 107 |
| 1.0 | 10.8 | 455 | 256 |
| 1.5 | 26.9 | 304 | 425 |
| 2.0 | 52.4 | 238 | 621 |

Rotor 34, shown in FIG. 1, is attached to central support plate 38 onto which are mounted an annular array of Perkins tubes 44 or heat pipes 46. Closely spaced annular fins 48 are in heat conductive contact with the Perkins tubes or heat pipes. The dimensions of the inner and outer fin diameters and spacing between fins follows the teachings of U.S. Pat. No. 3,863,454 for efficient heat transfer and air pumping. Therein it is found that, for optimum heat exchange, the Taylor number should be about 6 and the ratio of the inner to outer diameters should be between about 0.7 and about 0.85. These values are affected somewhat by the efficiency of heat exchange within the Perkins tubes or heat pipes, and the diameter ratio can be reduced to about 0.65 without appreciable harm to the air side heat transfer.

The combination of rotor 34 and shaded pole stator 50 comprise the electric motor which spins the array of Perkins tubes or heat pipes. Since shaded pole motors are typically high slip, a four pole motor of this type will spin the Perkins tubes or heat pipes at a speed of 1,650 rpm. The speed of the shaded pole motor may be decreased by inserting a choke or resistor in series with the stator winding. If higher speeds are desired, a two-pole shaded pole motor may be employed in combination with the aforementioned use of a choke or resistor. Wire baskets 10 and 12 within the cabinet and in ambient air are made such that the free flow area is about 70%.

The compact electronic cabinet cooler air flow is determined by its speed of rotation. It has been determined by experiments that the aforementioned Taylor number, and for Taylor numbers between 5 and 10, the volume of air flow is proportional to the outer diameter of fins 48, the speed of rotation and the axial length of the finned arrays, either within the cabinet or external to the cabinet. The product of the air flow, the effectiveness of the compact electronic cabinet cooler and the permissible temperature difference between the electronic cabinet and ambient air, determines the cooling capacity of the cabinet cooler. Consequently, the amount of cooling that the cabinet cooler can provide is directly related to the speed of operation up to the speed at which the centrifugal force field overcomes the capillary pumping capability of the porous medium 74, in the case of heat transfer tubes consisting of heat pipes 46.

Consider a compact electronic cabinet cooler of the construction described hereinbefore, transferring 2400 Btu/hr of thermal energy and possessing 20 heat pipes 46. Each heat transfer tube, therefor, must transport 120 Btu/hr. (35.1 watts) and the permeability of sintered porous medium 74 must be at least 2.5 darcys. The heat pipes are able to operate in a force field of 700 gravities or less.

EXAMPLE

The design of a compact electronic cabinet cooler was investigated. The diameter of the cooler at the outside diameter of fins 48 is taken as 8.5 inches; the diameter of the cooler at the inside diameter of the fins is 5.5 inches; the length of the finned tubes in the cabinet equals the length of the finned tubes in the ambient air, and is 2.5 inches. The fin material is 1100 aluminum temper H-16, its thickness is 10 mils, and the fin pitch is 40 mils. The space between fins is therefore 30 mils. Wire baskets 10 and 12 may be procured, for example, from RON-VIK, INC. of Minneapolis, Minn. They are constructed of 0.0625 inch diameter welded wire mesh and have a free airflow of 70%. Perkins tubes 44 and heat pipes 46 are 0.55 inch in diameter and there are 22 spaced apart equally in an annular array. The internal shaded pole rotor 34 turns at 1650 rpm. The capacity of the compact electronic cabinet cooler is to be determined when the difference between the cabinet air and ambient air is 38° F. (20° C.).

The airflows 56 in the cabinet and 60 in the ambient air are each 149 SCFM. These airflows are identical because the mechanical designs within the cabinet and in the ambient air are identical. At a rotating speed of 1500 rpm, these airflows will be 135 SCFM, and at 1800 rpm these airflows will be 162 SCFM.

Consider first the performance of a compact electronic cabinet cooler employing Perkins tubes 44 as the heat transport elements. The outside diameter of Perkins tubes 44 in FIG. 3 is 0.55 inch and the tube wall thickness is 25 mils. Projections 64 are approximately 25 mils high, approximately 25 mils wide, and are on a pitch of approximately 50 mils. The effective internal area, discounting the fin effect, is about twice the area of a 0.5 inch internal diameter tube without projections 64. The tube material is copper, the working fluid 70 is water formulated in accordance with the teachings of U.S. Pat. No. 5,945,031.

The centrifugal force field to which the Perkins tubes are subjected at a rotational speed of 1650 rpm is 271 gravities. The Perkins tube will operate in any centrifugal force field. It is preferred to operate in a force field of at least 200 gravities, or a rotational speed of at least about 1400 rpm. Working fluid 70 half fills the Perkins tube. All non condensible air is evacuated from within the Perkins tube through fill tube 66 which is subsequently sealed, as by welding.

In accordance with the teachings of U.S. Pat. No. 5,303,565 the evaporative heat transfer coefficient at a working fluid temperature of 100° F. is 530 Btu/hr-ft$^2$-° F. at the estimated heat flux of 3500 Btu/hr-ft$^2$. The condensing coefficient in this high force field is an order of magnitude higher. External to the Perkins tubes, the airflow between fins 48 is laminar and the minimum value of the heat transfer coefficient is completely described by the ratio of the thermal conductivity of the air and one-half the thickness of the air gap between the fins. The internal and external heat transfer characteristics are, consequently, completely described when the rotor is revolving at 1650 rpm.

The number of transfer units (NTU) is 0.64, the effectiveness is 36.2%, and the amount of heat extracted from the electronic cabinet is 2090 Btu/hr (612 watts). The amount of heat extracted at 1500 rpm will be somewhat less than 1890 Btu/hr (553 watts) and at 1800 rpm somewhat more than 2270 Btu/hr (665 watts). These anomalies obtain because the evaporative Nusselt number (U.S. Pat. No. 5,303,565) varies as the 0.32 power of the force field. The evaporative thermal resistance in Perkins tubes of the aforementioned design is 30% of the total thermal resistance between the heated cabinet air and the cooler ambient air which is a rather large fraction.

Consider the performance of a compact electronic cabinet cooler employing heat pipes 46 as the heat transport elements. The outside diameter of heat pipe 46 in FIG. 4 is 0.55 inch and the tube wall thickness is 25 mils. Longitudinal projections 72 separate and isolate a sintered porous medium 74. Longitudinal projections 72 are approximately 40 mils high and are about 10 mils thick. Effectively, independent strips of sintered porous medium 74 run lengthwise along the inside wall of heat pipe 46. U.S. Pat. No. 3,537,514 teaches that working fluid condensed between projections in a condenser is pumped along the channel formed by adjacent projections into the evaporator wherein it is evaporated and returned to the condenser in vapor form.

Rotating heat exchangers constructed with heat pipes containing only internal grooves have been found to lose a large portion of their effectiveness when rotated at speeds which develop centrifugal force fields in excess of 50 gravities. In order to increase the working fluid retention between projections 72 in force fields in excess of 200 gravities, sintered porous medium 74 is placed between the projections. This obtains at the expense of heat transport capacity.

The inside surface of heat pipe 46 must contain a sufficient number of projections 72 such that the wicking height of sintered porous medium 74 need only be equal to the height 76 of projections 72 in the centrifugal force field encountered during operation of the compact electronic cabinet cooler. For example, if only four projections 72 existed on the inside diameter, then the working height of the wick would have to be one-half the inside diameter of the heat pipe, or 250 mils. In this circumstance the wicking height under normal gravity conditions must exceed 50 inches and, in a centrifugal force field of 200 gravities each heat pipe will transport less than 100 Btu/hr. It has been found that the optimum dimensions of sintered porous medium 74 is to make the width approximately equal to the height 76 of projections 72, as illustrated in FIG. 4.

Sintered porous medium 74 consists of spherical particles such that they pass through a 100 mesh sieve but not through a 200 mesh sieve. Considering the working fluid to be pure water, the heat pipe materials, such as copper, must be compatible with water. The aforementioned spherical particles, when compacted by vibration and sintered at 1600° F. (871° C.) for one hour, results in a porous medium with a mean pore size of 0.78 mils and a porosity of about 35%. Consequently, the permeability is 6.25 darcys. This porous sintered medium is capable of operating in centrifugal force fields below 580 gravities without drainage of interstitial working fluid. That is, the design of this example is able to operate at speeds up to 2420 rpm without the loss of interstitial working fluid.

In accordance with the teachings of U.S. Pat. No. 3,523,577 the internal evaporative heat transfer coefficient is very high and this, combined with the extremely high condensing heat transfer coefficient, yields a heat pipe which has very low internal thermal resistance. The amount of pure water charged into the completely evacuated heat pipe is just sufficient to fill the pores within the sintered porous medium 74 and to supply the liquid required by the vapor inventory. Therefore, the entire internal porous surface is available for heat transfer.

The air side airflow and heat transfer are not affected by the choice of Perkins tubes or heat pipe heat transport elements. The thermal performance of the compact electronic cabinet cooler is enhanced only because the heat pipe has lower internal thermal resistance. This is only true if the centrifugal force field does not exceed the capability of the wick design. The number of transfer units for the aforementioned sintered porous wick design for a compact electronic cabinet cooler operating at 1650 rpm, is 0.83 and the effectiveness is 40.5%. For a 38° F. (20° C.) temperature difference between the air within the electronic cabinet and the external ambient air, this unit will extract 2346 Btu/hr (687 watts) of thermal energy. The total energy dissipated by the cabinet walls and the compact cabinet cooler is, obviously, somewhat higher.

The diameter of the illustrated compact electronic cabinet cooler of this example is 8.94 inches and the length is 5.63 inches. Therefore, the volume of the compact electronic cabinet cooler is 0.20 cubic feet. A 2400 Btu/hr (703 watts) compact cabinet cooler, as advertised on page 502 in McMaster-Carr's catalog No. 106, is 14 inches long by 7.75 inches wide and 7.5 inches deep. The volume is 0.47 cubic feet. Thus, the volume occupied by the electronic cabinet cooler of this example of this invention is less than 50% of the volume occupied by available commercial units. This is advantageous where space is at a premium.

Capacity may be regulated by changing rotor speed. Capacity is roughly proportional to the speed of rotation. In order to avoid blocking the air passages in the heat exchanger with dust/lint, the airside airstream should be filtered.

The cabinet cooler of this invention provides for the effective removal of heat from electrical and electronic cabinetry. It removes heat without drawing outside air through the electrical components being cooled. It does not use traditional fans that generate noise which can be detrimental in both civilian and military applications. Not only are the two commonly used fans eliminated, thereby reducing the volume of the cooler, further reduction in volume is achieved by nesting the motor inside the rotating unit.

The uniqueness of the cabinet cooler of this invention resides in rotating air-to-air heat exchangers employing Perkins tubes or heat pipes in high centrifugal fields. High efficiencies in compact packages result. Further, because of the utilization of rotating Perkins tubes or heat pipes, airside heat transfer and airflow occur in silent laminar-flow airstreams. This circumvents the need for traditional fans to produce air movement for the heat exchanger. All of these features are embodied in a compact unit applicable to both large and small high energy electrical, electronic and other cabinet applications requiring clean, cool, internal environments.

It will be apparent to those skilled in the art that various changes may be made in the size, shape, type, number and arrangement of parts described hereinbefore, without departing from the spirit of this invention and the scope of the appended claims.

I claim:

1. A cooler for a compact electronic cabinet space, comprising:

a) a housing adapted for support on a cabinet to be cooled, b) a separator member in the housing dividing the housing into an evaporator section and a condenser section, the housing being perforated in both evaporator and condenser sections, the condenser section being disposed outside the cabinet space to be cooled, c) a plurality of heat transport tubes in the housing extending through the separator member and spaced apart in an annular array, d) a shaft mounted on the housing and supporting the separator member and heat transport tubes for rotation about the axis of the shaft, e) a plurality of closely spaced annular heat conductive fins secured in thermal contact with the outer surface of each heat transport tube and having a ratio of inner to outer diameters ranging between about 0.65 and 0.85, the fins being spaced apart from each other along the length of the heat transport tube, and f) a rotary drive motor housed in the condenser section and mounted on the shaft within the housing and concentrically about the annular array of heat transport tubes and engaging the separator member for rotating said separator member and heat transport tubes about the axis of the shaft at a centrifugal force field of at least 200 gravities.

2. The cooler of claim 1 wherein the heat transport tubes are Perkins tubes.

3. The cooler of claim 2 including heat transfer liquid in the Perkins tubes for transporting heat from the condenser section to the evaporator section, the heat transfer liquid filling about one-half the interior volume of each tube.

4. The cooler of claim 3 including circumferentially spaced internal heat conductive projections extending substantially the length of each Perkins tube.

5. The cooler of claim 1 wherein the heat transport tubes are heat pipes.

6. The cooler of claim 5 including circumferentially spaced internal heat conductive projections extending substantially the length of each heat pipe, sintered spherical particles of porous heat conductive material having a permeability range of 2.3 to 52.4 Darcys in the space between said projections, and heat transfer fluid in the heat pipes for transporting heat from the condenser section to the evaporator section, the heat transfer fluid filling substantially only the pores of the sintered spherical particles of porous heat conductive material and the diameter of the pores ranging from 0.5 to 2.0 mils.

7. The cooler of claim 1 wherein the drive motor is capable of rotating the separator member and heat transport tubes to speeds of at least about 1400 rpm.

8. The cooler of claim 1 wherein the ratio of inner to outer diameters of each annular fin is about 0.65, the speed of rotation is about 1650 rpm, and the fin pitch is 40 mils.

9. The cooler of claim 1 wherein
 a) the heat transport tubes are Perkins tubes,
 b) circumferentially spaced internal heat conductive projections extend substantially the length of each Perkins tube,
 c) heat transfer liquid in the Perkins tubes for transporting heat from the condenser section to the evaporator sections, the heat transfer fluid filling substantially one-half the interior volume of each tube,
 d) heat conductive fins secured in heat conductive relation with and projecting radially outward from each Perkins tube and spaced apart along substantially the entire external length of each Perkins tube for enhancing the heat transfer of the tube, and
 e) the drive motor is capable of rotating the separator member and Perkins tubes to speeds of at least about 1400 rpm.

10. The cooler of claim 1 wherein
 a) the heat transport tubes are heat pipes,
 b) circumferentially spaced internal heat conductive projections,
 c) sintered porous heat conductive material in the spaces between said projections,
 d) heat transfer liquid in the heat pipes for transporting heat from the condenser section to the evaporator section, the heat transport liquid filling substantially only the pores of the sintered porous heat conductive material, and
 e) the drive motor is capable of rotating the separator member and heat pipes to speeds of at least about 1400 rpm.

* * * * *